(12) United States Patent
Ko et al.

(10) Patent No.: US 10,468,869 B2
(45) Date of Patent: Nov. 5, 2019

(54) HIGH VOLTAGE TRANSMIT / RECEIVE SWITCH AND VOLTAGE DETECTION CIRCUIT

(71) Applicant: Microchip Technology Incorporated, Chandler, AZ (US)

(72) Inventors: Isaac Ko, Kwun Tong (HK); Ka Wai Ho, Diamond Hill (HK); Wan Tim Chan, Yuen Long (HK)

(73) Assignee: Microchip Technology Incorporated, Chandler, AZ (US)

( * ) Notice: Subject to any disclaimer, the term of this patent is extended or adjusted under 35 U.S.C. 154(b) by 319 days.

(21) Appl. No.: 15/461,921

(22) Filed: Mar. 17, 2017

(65) Prior Publication Data

US 2017/0279263 A1 Sep. 28, 2017

Related U.S. Application Data

(60) Provisional application No. 62/311,473, filed on Mar. 22, 2016.

(51) Int. Cl.
*H02H 3/20* (2006.01)
*H04B 11/00* (2006.01)
*H03K 17/0812* (2006.01)
*H03K 17/687* (2006.01)

(52) U.S. Cl.
CPC ......... *H02H 3/20* (2013.01); *H03K 17/08122* (2013.01); *H03K 17/6874* (2013.01); *H03K 2217/0054* (2013.01); *H04B 11/00* (2013.01)

(58) Field of Classification Search
CPC ..... A61B 8/4483; A61B 8/469; B06B 1/0215; G01S 7/5202; G01S 7/52025; H01L 2223/6677; H01L 23/49838; H01L 27/0251; H01P 1/15; H02H 3/20; H02H 9/046; H03K 17/08; H03K 17/0812; H03K 17/08122; H03K 17/0814; H03K 17/08142; H03K 17/0822; H03K 17/102; H03K 17/687; H03K 17/6871; H03K 17/6874; H03K 19/0944; H03K 2217/0009; H03K 2217/0054; H03M 1/0845; H04B 1/48; H04B 11/00
See application file for complete search history.

(56) References Cited

U.S. PATENT DOCUMENTS 5,696,659 A * 12/1997 Maruo ................ H01L 27/0251
361/93.1
5,742,463 A * 4/1998 Harris .................... H02H 9/025
361/111

(Continued)

FOREIGN PATENT DOCUMENTS

GB 2145593 A 3/1985

*Primary Examiner* — Thienvu V Tran
*Assistant Examiner* — Nicolas Bellido
(74) *Attorney, Agent, or Firm* — Burr & Forman LLP; Ryan M. Corbett

(57) ABSTRACT

An analog transmit/receive switch and voltage detection circuit that do not require depletion mode devices are provided. The switch may be configured to operate in a receive mode and a protection mode. The voltage detection circuit may be coupled to the switch and may be configured to measure a potential difference between two terminals of the switch. The switch and the voltage detection circuit may not include any depletion mode devices.

7 Claims, 3 Drawing Sheets

(56) References Cited

U.S. PATENT DOCUMENTS

| | | | |
|---|---|---|---|
| 6,094,088 A * | 7/2000 | Yano | H03K 17/693 |
| | | | 327/534 |
| 6,804,502 B2 * | 10/2004 | Burgener | H01P 1/15 |
| | | | 455/333 |
| 7,324,315 B2 * | 1/2008 | Harris | H02H 9/025 |
| | | | 361/58 |
| 7,576,962 B2 * | 8/2009 | Harris | H02H 3/025 |
| | | | 361/111 |
| 2008/0258799 A1 * | 10/2008 | Teraguchi | H03K 17/005 |
| | | | 327/427 |
| 2011/0026185 A1 | 2/2011 | Boudet | |
| 2011/0063011 A1 * | 3/2011 | Barlow | H01L 29/0692 |
| | | | 327/328 |
| 2012/0320476 A1 | 12/2012 | Disney | |
| 2016/0169945 A1 * | 6/2016 | Mauder | G01R 31/3274 |
| | | | 324/126 |

\* cited by examiner

HIGH VOLTAGE TRANSMIT / RECEIVE SWITCH AND VOLTAGE DETECTION CIRCUIT

CROSS-REFERENCE TO RELATED APPLICATION

This application claims the benefit of U.S. Provisional Patent Application No. 62/311,473, filed on Mar. 22, 2016, which is incorporated herein by reference in its entirety.

TECHNICAL FIELD

The present disclosure generally relates to an analog switch and voltage detection circuit that do not require depletion mode devices.

SUMMARY

According to the related art, a two terminal transmit/receive (T/R) switch may pass small analog signals with a constant low resistance value and quickly turn itself off when the presence of high voltage is detected. The switch may be connected between an ultrasound transducer and the input of a low noise, low voltage, receiver amplifier, and can protect the input against the high voltage transmit signals in ultrasound applications without the aid of any control signal and high-voltage power supplies.

A detailed block diagram of a T/R switch according to the related art is shown in FIG. 1. The basic blocks for the switch are the four-transistor butterfly (symmetrical) switch and the voltage detection circuit.

The two-terminal high voltage T/R protection switch has a constant resistance characteristic when small signals, e.g., amplitudes within approximately ±300 mV, are applied. When high voltages, e.g., amplitudes larger than 2V are seen, the voltage detection circuit will pinch off one of the two depletion-mode PMOS transistors, so as to cut off the current path of the symmetrical switch. I-V characteristics of the T/R switch of FIG. 1 are shown in FIG. 2.

The switch according to the related art consists of depletion-mode high-voltage NMOS transistors and depletion-mode PMOS transistors, which are nominally on to pass a small analog signal and detect the presence of high voltage. Accordingly, although some facilities are able to fabricate these related art switches, the switches impose problems to other BCD process foundries which do not provide depletion devices of any type.

In an attempt to implement an analog switch without high voltage supplies, bootstrap and translinear loop techniques are used in the exemplary embodiment of FIG. 3. The translinear loop may regulate VGS of the symmetrical switch and matches its conductance to the transconductance of M5, given M1, M2 and M5 are matched in size. Referring to FIG. 3, the switch may include two terminals SWA and SWB, which correspond respectively to the drain terminals of transistors M1 and M2. The source terminals of transistors M1 and M2 are coupled together, and are also coupled to the gate terminal of transistor M3. The source terminal of transistor M3 is coupled to the source terminal of transistor M4, which are both coupled via a diode to a 1 mA current source that is coupled to VSS. The gate and drain terminals of transistor M4 are coupled together, and are both coupled to the source terminal of transistor M5. The gate and drain terminals of transistor M5 are coupled together, and are coupled to the gate terminals of transistors M1 and M2. The drain terminal of transistor M5 is coupled via a diode to a 500 mA current source, which is coupled to VDD via a PMOS transistor.

Accordingly, the T/R switch according to one or more exemplary embodiments of the present disclosure may be able to pass small analog signal and block ±90V without high voltage supplies and without any depletion or thick oxide device, and thus is transferrable to different BCD processes.

According to an aspect of one or more exemplary embodiments, there is provided an apparatus include a switch configured to operate in a receive mode and a protection mode, and voltage detection circuit coupled to the switch that measures a potential difference between two terminals of the switch. The switch and the voltage detection circuit may not include any depletion mode devices.

The switch may be configured to automatically switch between receive and protection modes without control signals. The switch may also include first and second NMOS transistors whose source terminals are coupled together. The switch may not include any PMOS transistors.

The apparatus may also include third and further transistors configured to turn off the switch. The source terminals of the third and fourth transistors may be coupled to the source terminals of the first and second NMOS transistors, and the drain terminals of the third and fourth transistors may be coupled to the gate terminals of the first and second NMOS transistors.

The voltage detection circuit may include first and second rheostats configured to measure the potential difference between the two terminals of the switch. The gate terminal of the third transistor may be coupled to the first rheostat, and a gate terminal of the fourth transistor may be coupled to the second rheostat. The switch may be configured to switch between the receive mode and the protection mode based on a threshold voltage of the third transistor or a threshold voltage of the fourth transistor. The third and fourth transistors may be NMOS transistors. In the receive mode, the resistance of the switch may be substantially constant. In the protection mode, the switch may operate as a constant current source.

DETAILED DESCRIPTION OF EXEMPLARY EMBODIMENTS

Figure 1:
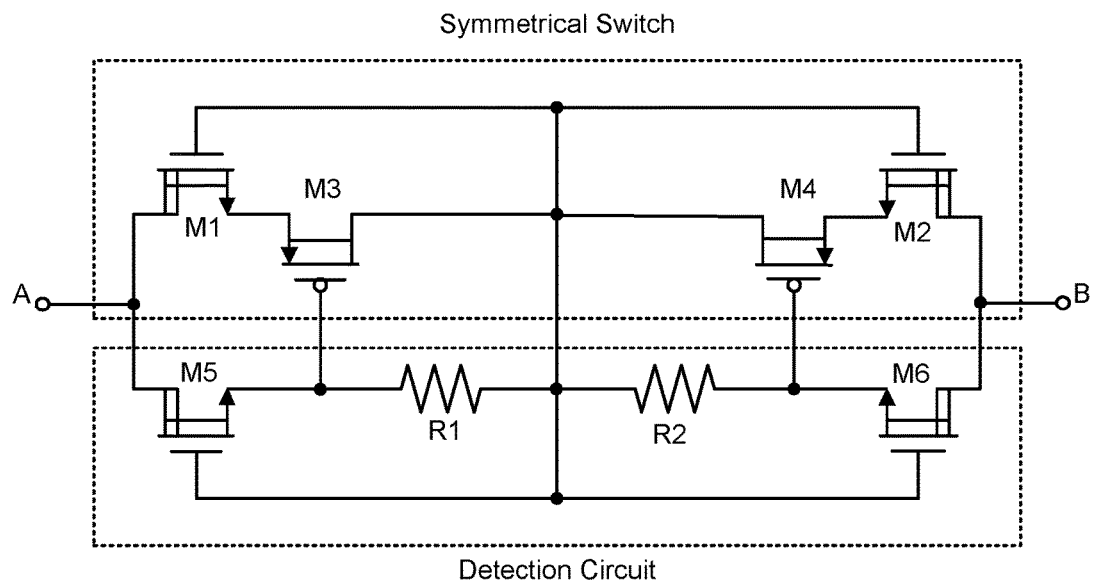
FIG. 1 depicts a T/R switch according to the related art.
Figure 2:
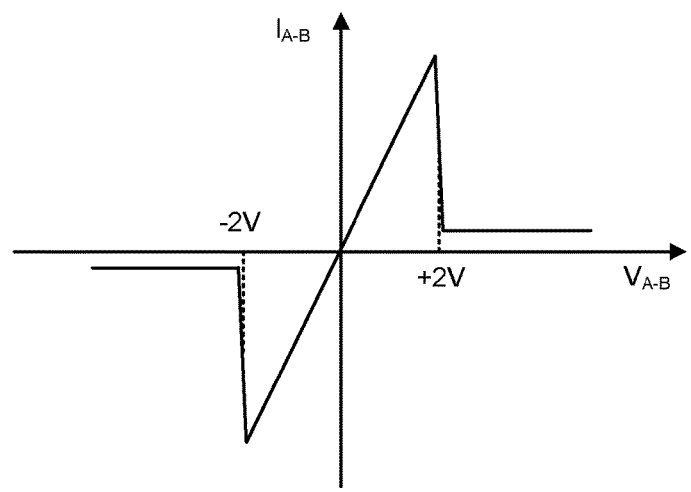
FIG. 2 depicts the I-V characteristics of the T/R switch shown in FIG. 1.
Figure 3:
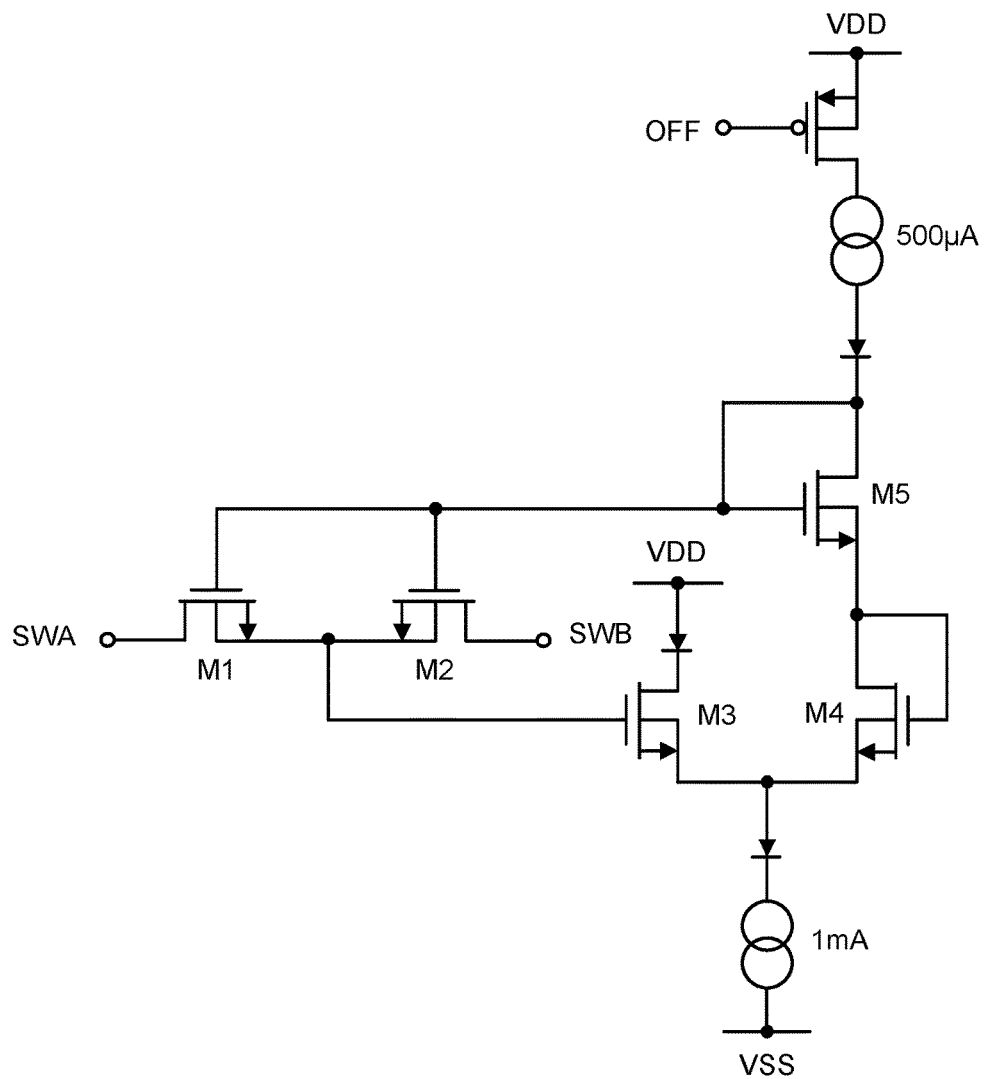
FIG. 3 depicts an analog switch circuit using a translinear loop according to an exemplary embodiment.

Reference will now be made in detail to the following exemplary embodiments, which are illustrated in the accompanying drawings, wherein like reference numerals refer to like elements throughout. The exemplary embodiments may be embodied in various forms without being limited to the exemplary embodiments set forth herein. Descriptions of well-known parts are omitted for clarity.

Figure 4:
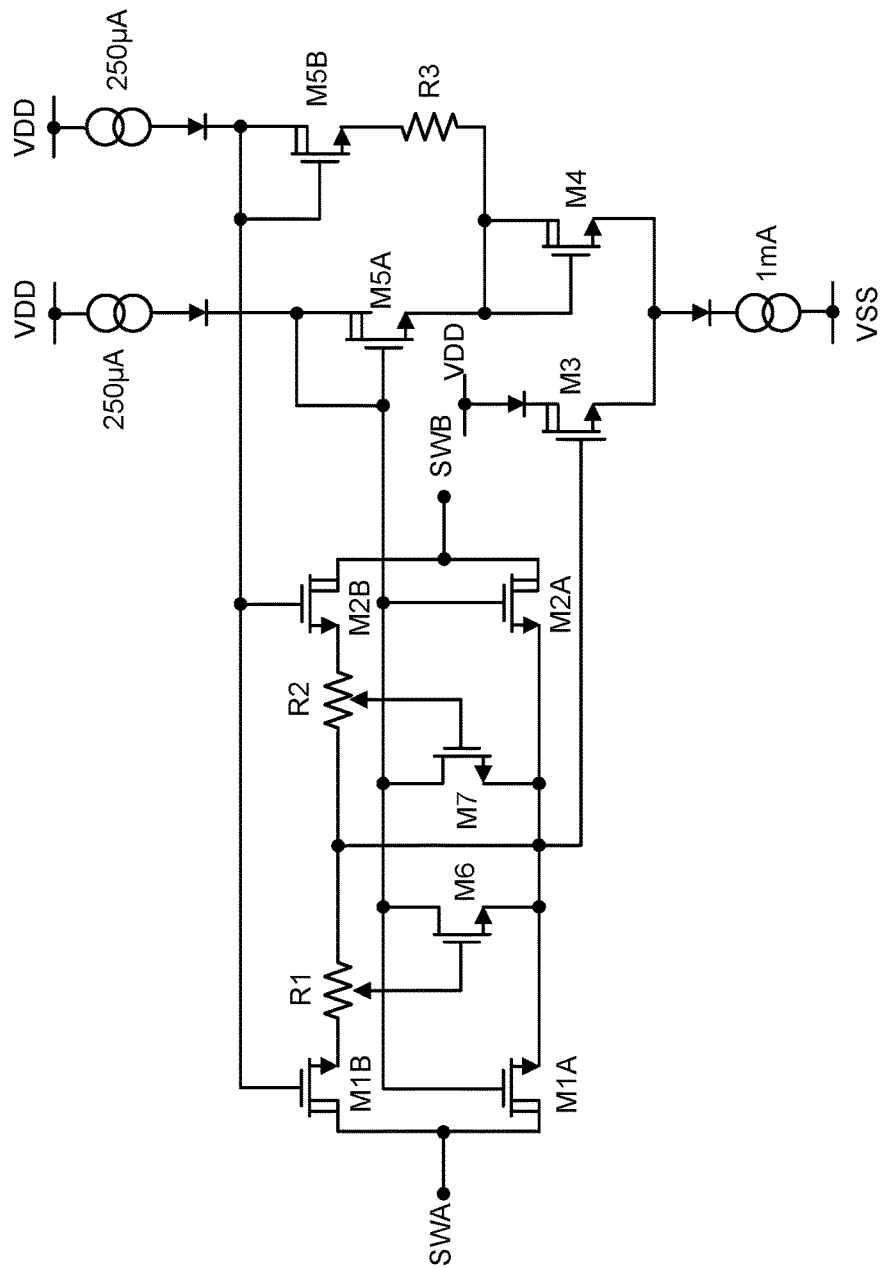
FIG. 4 depicts a T/R switch according to an exemplary embodiment.

Referring to FIG. 4, an exemplary embodiment of the present disclosure is shown, which includes an analog switch and a voltage detection circuit. In general, the analog switch includes two terminals SWA and SWB, and has two modes of operation: 1) receive or closed circuit mode and 2)

protection or open circuit mode. In the receive mode, the analog switch resistance is fairly constant due to the trans-linear loop technique. Distortion is minimized and only limited by the parasitic capacitances to any AC ground path that would also attenuate the signal and introduce electrical noise. In the protection mode, the combined switch protects the low voltage low noise receiver amplifier against both positive and negative high-voltage pulses, by transforming itself to a high-impedance constant current source. The DC current going through the combined switch is defined by the current mirrors M1B, M2B and M5B. The combined switch automatically switches between receive and protection modes without control signals.

The combined switch according to the exemplary embodiment of FIG. 4 may include transistors M1A and M2A whose source terminals are coupled together. A pair of low-voltage NMOS switches M6 and M7 are added to shut down the symmetrical switch M1A and M2A. Different from the previous design, no series PMOS switch is needed so the symmetrical switch M1A and M2A can be much smaller than M1 and M2 of FIG. 1 and the parasitic capacitances are also much smaller in the exemplary embodiment of FIG. 4. Apart from the way the symmetrical switch is cut off, the voltage detection circuit, which consists of M1B, M2B, R1 and R2 is similar to that of FIG. 1, except M1B and M2B, just like all other transistors in FIG. 4, are enhancement mode devices with a low-voltage gate oxide. The tipping voltage between receive and protection modes is just the threshold voltage of M6 or M7 multiplied by the rheostat ratio of R1 or R2. If the rheostats are tapped at center and the threshold voltages of M6 and M7 are 1V, then the tipping voltage will be about 4V. The source terminals of transistors M1A and M2A are coupled together, and are also coupled to the gate terminal of transistor M3. The source terminal of transistor M3 is coupled to the source terminal of transistor M4, which are both coupled via a diode to a 1 mA current source that is coupled to VSS. The gate and drain terminals of transistor M4 are coupled together, and are both coupled to the source terminal of transistor M5A. The gate and drain terminals of transistor M5A are coupled together, and are coupled to the gate terminals of transistors M1 and M2, and the drain terminals of transistors M6 and M7. The drain terminal of transistor M5A is coupled via a diode to a 250 uA current source, which is coupled to VDD. The drain and gate terminals of transistor M4 are coupled to resistor R3, which is coupled in series to the source terminal of transistor MB5. The gate and drain terminals of transistor MB5 are coupled together, and are coupled to the gate terminals of transistors M1B and M2B. The gate and drain terminals of transistor MB5 are also coupled via a diode to a 250 uA current source, which is coupled to VDD.

The T/R switch according to the exemplary embodiment described above does not require depletion mode devices (i.e., device that is normally conducting without the application of a gate bias voltage). Translinear loop and bootstrap operation realize constant on-resistance of the symmetrical switch in receive mode. Therefore, the exemplary embodiment shown in FIG. 4 may eliminate the harmonic distortion due to the signal dependent on-resistance. The voltage detection circuit of the exemplary embodiment of FIG. 4 may measure the potential difference between the two switch terminals with a pair of resistors R1 and R2. A scaled-down voltage at the rheostat tap of R1 and R2 may adjust the tipping voltage between receive and protection mode, which is only a function of the M6 or M7 threshold voltage. With such flexibility of the tipping voltage adjustment and without any depletion mode or thick gate oxide device, the T/R switch of the exemplary embodiment can be easily implemented with all nominal BCD processes.

Although the inventive concepts of the present disclosure have been described and illustrated with respect to exemplary embodiments thereof, it is not limited to the exemplary embodiments disclosed herein and modifications may be made therein without departing from the scope of the inventive concepts.

What is claimed is:

1. An apparatus comprising:
    a switch configured to operate in a closed circuit mode and an open circuit mode; and
    a voltage detection circuit coupled to the switch that measures a potential difference between two terminals of the switch;
    wherein the switch and the voltage detection circuit do not include any depletion mode devices;
    wherein the switch comprises first and second NMOS transistors whose source terminals are coupled together;
    wherein the switch further comprises a third transistor and a fourth transistor configured to turn off the switch;
    wherein source terminals of the third and fourth transistors are coupled to the source terminals of the first and second NMOS transistors; and
    wherein drain terminals of the third and fourth transistors are coupled to gate terminals of the first and second NMOS transistors.

2. The apparatus of claim 1, wherein the switch does not include any PMOS transistors.

3. The apparatus of claim 1, wherein the voltage detection circuit comprises first and second rheostats configured to measure the potential difference between the two terminals of the switch; and
    wherein a gate terminal of the third transistor is coupled to the first rheostat, and a gate terminal of the fourth transistor is coupled to the second rheostat.

4. The apparatus of claim 3, wherein the switch is configured to switch between the closed circuit mode and the open circuit mode based on a threshold voltage of the third transistor or a threshold voltage of the fourth transistor.

5. The apparatus of claim 1, wherein the third and fourth transistors are NMOS transistors.

6. The apparatus of claim 1, wherein in closed circuit mode, the resistance of the switch is substantially constant.

7. The apparatus of claim 1, wherein in the open circuit mode, the switch operates as a high-impedance constant current source that holds an electrical current.

* * * * *